United States Patent
Ha

(10) Patent No.: US 9,905,613 B2
(45) Date of Patent: Feb. 27, 2018

(54) MOVEMENT OF OXYGEN VACANCIES IN AN ELECTRONIC DEVICE

(71) Applicant: SK hynix Inc., Icheon (KR)

(72) Inventor: Tae-Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/357,977

(22) Filed: Nov. 21, 2016

(65) Prior Publication Data

US 2017/0077181 A1    Mar. 16, 2017

Related U.S. Application Data

(62) Division of application No. 14/562,113, filed on Dec. 5, 2014, now abandoned.

(30) Foreign Application Priority Data

Aug. 22, 2014    (KR) .......................... 10-2014-0109603

(51) Int. Cl.
| | |
|---|---|
| *H01L 45/00* | (2006.01) |
| *H01L 27/24* | (2006.01) |
| *H01L 29/24* | (2006.01) |
| *H01L 29/06* | (2006.01) |
| *H01L 29/423* | (2006.01) |
| *H01L 29/78* | (2006.01) |
| *G06F 13/28* | (2006.01) |
| *G06F 13/42* | (2006.01) |

(Continued)

(52) U.S. Cl.
CPC .......... *H01L 27/2454* (2013.01); *G06F 13/28* (2013.01); *G06F 13/4282* (2013.01); *G11C 13/0007* (2013.01); *H01L 29/0657* (2013.01); *H01L 29/24* (2013.01); *H01L 29/4232* (2013.01); *H01L 29/78* (2013.01); *H01L 29/7869* (2013.01); *H01L 45/08* (2013.01); *H01L 45/1206* (2013.01); *H01L 45/1226* (2013.01); *H01L 45/1233* (2013.01); *H01L 45/146* (2013.01); *G11C 2213/53* (2013.01); *H01L 27/228* (2013.01)

(58) Field of Classification Search
CPC ................. H01L 45/146; H01L 45/147; H01L 27/11585; H01L 27/11597; H01L 27/1159; H01L 27/228; H01L 27/2454; H01L 27/249; H01L 29/7827; H01L 45/04; H01L 45/08
See application file for complete search history.

(56) References Cited

U.S. PATENT DOCUMENTS

| | | |
|---|---|---|
| 6,624,463 B2 | 9/2003 | Kim et al. |
| 2009/0174428 A1* | 7/2009 | Karg ...................... H01L 29/24 |
| | | 326/38 |

(Continued)

FOREIGN PATENT DOCUMENTS

| | | | |
|---|---|---|---|
| KR | 10-2006-0105360 A | 10/2006 | |
| KR | 10-1046719 B1 | 7/2011 | |
| WO | WO 2014034420 A1 * | 3/2014 | ......... H01L 45/1206 |

*Primary Examiner* — Benjamin Sandvik
*Assistant Examiner* — Leslie Pilar Cruz

(57) ABSTRACT

An electronic device includes a transistor. The transistor includes a body including a metal oxide; a gate electrode; and a gate insulating layer interposed between the body and the gate electrode, wherein the transistor is turned on or turned off by movement of oxygen vacancies in the body according to voltages applied to the gate electrode and the body.

7 Claims, 13 Drawing Sheets

(51) Int. Cl.
 *G11C 13/00* (2006.01)
 *H01L 29/786* (2006.01)
 *H01L 27/22* (2006.01)

(56) References Cited

U.S. PATENT DOCUMENTS

2015/0171319 A1* 6/2015 Nigo ................... H01L 45/1206
                                                                365/148
2015/0357379 A1* 12/2015 Tajima ................ H01L 27/2454
                                                                257/4

* cited by examiner

MOVEMENT OF OXYGEN VACANCIES IN AN ELECTRONIC DEVICE

CROSS-REFERENCE TO RELATED APPLICATION

The present application is a divisional of U.S. patent application Ser. No. 14/562,113, filed on Dec. 5, 2014, which claims priority to Korean Patent Application No. 10-2014-0109603, entitled "ELECTRONIC DEVICE" and filed on Aug. 22, 2014, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can include a transistor having an excellent characteristic.

In an embodiment, an electronic device includes a transistor that comprises a body including a metal oxide; a gate electrode; and a gate insulating layer interposed between the body and the gate electrode, wherein the transistor is turned on or turned off by movement of oxygen vacancies in the body according to voltages applied to the gate electrode and the body.

Embodiments of the above device may include one or more of the following.

Turning the transistor on includes moving the oxygen vacancies toward the gate electrode in the body, and wherein turning the transistor off includes moving the oxygen vacancies away from the gate electrode in the body. Oxygen ions in the body move in an opposite direction to the oxygen vacancies. When the voltage applied to the gate electrode, the body, or both is removed, the transistor maintains an on state or an off state present just before the removal of the voltage. The body, the gate insulating layer and the gate electrode are sequentially stacked over a substrate in a direction perpendicular to a surface of the substrate. The transistor further comprising: a first junction region and a second junction region which are formed in the body at both sides of the gate electrode, respectively, and wherein a width of a region between the first junction region and the second junction region is less than or equal to a width of the gate electrode in a same direction. When the transistor is turned on, a conductive channel is formed by the oxygen vacancies between the first junction region and the second junction region. The transistor further comprising: a first junction region and a second junction region which are formed in the body at both sides of the gate electrode, respectively; a line coupled to the first junction region through a first contact; and a memory element coupled to the second junction region through a second contact. The body has a pillar shape which extends in a direction perpendicular to a surface of a substrate, and the gate electrode is in contact with a first side of the body with the gate insulating layer therebetween, and the transistor further comprising: a conductive pattern which is in direct contact with a second side of the body. The conductive pattern supplies a body voltage to the body. Each of the gate electrode and the conductive pattern has a line shape which extends in a first direction parallel to the surface of the substrate. A top surface of the gate electrode is located at a same level as or above a top surface of the body, and a bottom surface of the gate electrode is located at a same level as or below a bottom surface of the body. A top surface of the conductive pattern is located at a same level as or below a top surface of the body, and a bottom surface of the conductive pattern is located at a same level as or above a bottom surface of the body. The transistor further comprising: a first contact coupled to a bottom surface of the body; a second contact coupled to a top surface of the body; a line coupled to the first contact under the first contact; and a memory element coupled to the second contact over the second contact The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the transistor is part of at least one of the control unit, the operation unit and the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the transistor is part of at least one of the core unit, the cache memory unit and the bus interface in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the transistor is part of at least one of the processor, the auxiliary memory device, the main memory device and the interface device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the transistor is part of at least one of the controller, the storage device, the temporary storage device and the interface in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the transistor is part of at least one of the memory controller, the memory, the buffer memory and the interface in the memory system.

These and other aspects, implementations and associated advantages are described will become apparent in view of the drawings and the description of embodiments provided herein, which are intended to provide further explanation of the invention as claimed.

DETAILED DESCRIPTION

Figure 1A:
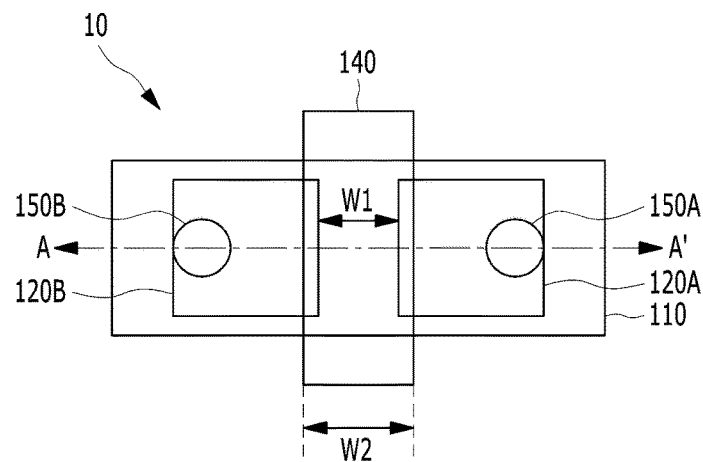
FIGS. 1A and 1B are views illustrating a transistor in accordance with an implementation and an example of a process for fabricating the transistor.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or over a second layer or "on" or "over" a substrate, the first layer may be directly formed on the second layer or the substrate, but may also represent a structure where one or more other intermediate layers exist between the first layer and the second layer or the substrate.

Figure 1B:
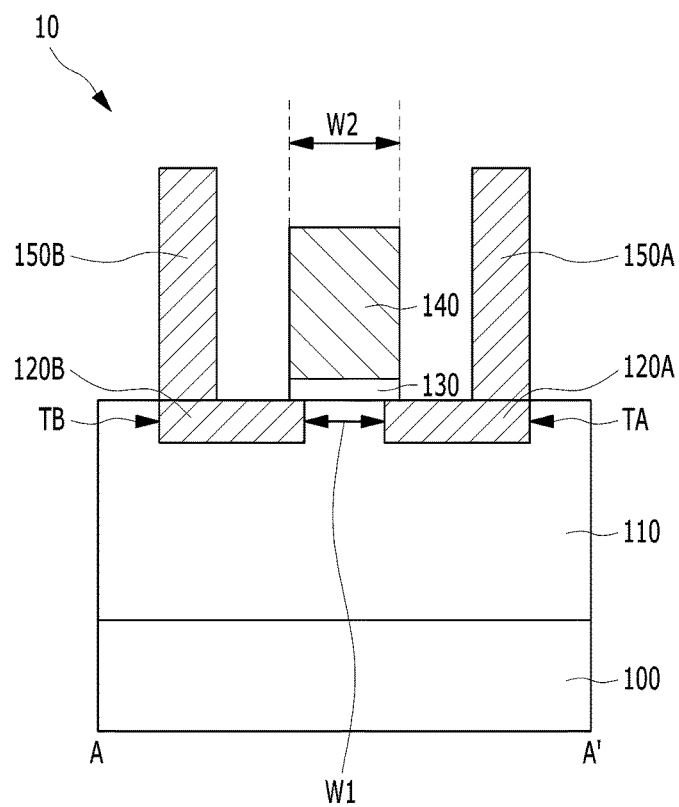

FIGS. 1A and 1B are views illustrating a transistor 10 in accordance with an implementation and an example of a process for fabricating the transistor 10. Specifically, FIG. 1A is a plan view, and FIG. 1B is a cross-sectional view taken along a line A-A' of FIG. 1A.

Referring to FIGS. 1A and 1B, the transistor 10 may include a substrate 100, a body 110 formed over the substrate 100, a gate insulating layer 130 formed over the body 110, a gate electrode 140 formed over the gate insulating layer 130, and first and second junction regions 120A and 120B formed in the body 110 at first and second sides of the gate electrode 140, respectively.

The substrate 100 may include additional elements (not shown), for example, a line for applying a voltage to the body 110.

The body 110 may provide a region in which a channel of the transistor 10 is to be formed. In this implementation, the body 110 may be formed of a metal oxide which has a variable resistance characteristic and can be used as a memory element in an RRAM, etc. For example, the body 110 may be formed of a transition metal oxide or a perovskite-based material. The metal oxide may contain oxygen vacancies and/or oxygen ions. In a memory device such as the RRAM, when a conductive path is formed by the oxygen vacancies in the metal oxide, the metal oxide may be in a low resistance state and store data '0'. On the other hand, when the conductive path is not present, the metal oxide may be in a high resistance state and store data '1'. However, in this implementation, the metal oxide may be used not as the memory element but as the body 110 of the transistor 10. The metal oxide may include an oxygen-rich material which satisfies a stoichiometric ratio, for example, tantalum pentoxide ($Ta_2O_5$), titanium dioxide ($TiO_2$), etc. The metal oxide may include an oxygen-deficient material which is deficient in oxygen compared to the oxygen-rich material, for example, a titanium oxide $TiO_x$ where x is smaller than 2, a tantalum oxide $TaO_y$ where y is smaller than 2.5, etc. When a volume of the oxygen-deficient material is the same as a volume of the oxygen-rich material, the number of the oxygen vacancies, the number of oxygen ions, or the number of both included in the oxygen-deficient material may be larger than the corresponding number included in the oxygen-rich material. Therefore, the mobility of the oxygen vacancies, oxygen ions, or both in the oxygen-deficient material may be increased compared to the corresponding mobility in the oxygen-rich material. The movement of the oxygen vacancies and/or oxygen ions will be described in more detail with reference to FIGS. 2A and 2B. In a plan view, the body 110 may have an island shape, and be separated from another body (not shown) by an isolation layer not shown) surrounding the body 110.

The gate insulating layer 130 and the gate electrode 140 may be sequentially stacked over the body 110. The gate insulating layer 130 may include one or more insulating materials, for example, a silicon oxide, a silicon nitride, or a combination thereof. The gate electrode 140 may include one or more conductive materials, for example, a metal, a metal nitride, a semiconductor material doped with an impurity, or a combination thereof. In a plan view, the gate electrode 140 may overlap with the body 110 and cross the body 110. Also the gate insulating layer 130 may be patterned together with the gate electrode 140 and have a same plan shape as the gate electrode 140. However, other implementations are also possible. The gate insulating layer 130 may have various shapes as long as the gate insulating layer 130 is interposed between the gate electrode 140 and the body 110. For example, the gate insulating layer 130 may cover entire top surfaces of the body 110, the first junction region 1204 and the second junction region 120B except for a region in which first and second contacts 150A and 150B are to be formed.

The first and second junction regions 120A and 120B may include one or more conductive materials, for example, a metal, a metal nitride, a semiconductor material doped with an impurity, or a combination thereof. A conductive channel may be formed in the body 110 between the first junction region 120A and the second junction region 120B. A region between the first junction region 1204 and the second junction region 120B may overlap with the gate electrode 140 and have a width W1 which is smaller than or substantially the same as a width W2 of the gate electrode 140. That is, the region between the first junction region 120A and the second junction region 120B may be fully covered by the gate electrode 140. As described below, the conductive channel may be formed by oxygen vacancies under the gate electrode 140. Therefore, when the width W1 of the region between the first junction region 120A and the second junction region 1206 is smaller than or substantially the same as the width W2 of the gate electrode 140, it is easy to form the conductive channel in the region between the first junction region 120A and the second junction region 120B.

The first junction region 120A and the second junction region 120B may be coupled to the first contact 150A and the second contact 1508 disposed over the first junction region 120A and the second junction region 120B, respectively. A memory element (not shown) may be formed over the first contact 150A to be coupled to the first contact 150A. A line (not shown) such as a bit line may be formed over the second contact 1506 to be coupled to the second contact 1508. When trying to access to the memory element in order to operate the memory element, the transistor 10 may be turned on, so an operating voltage or current may be supplied to the memory element through the line, the second contact 150B, the transistor 10 and the first contact 150A. On the other hand, when not trying to access to the memory element, the transistor 10 may be turned off.

Hereinafter, a process to turn on or turn off the transistor 10 will be described in more detail with reference to FIGS. 2A and 2B.

Figure 2A:
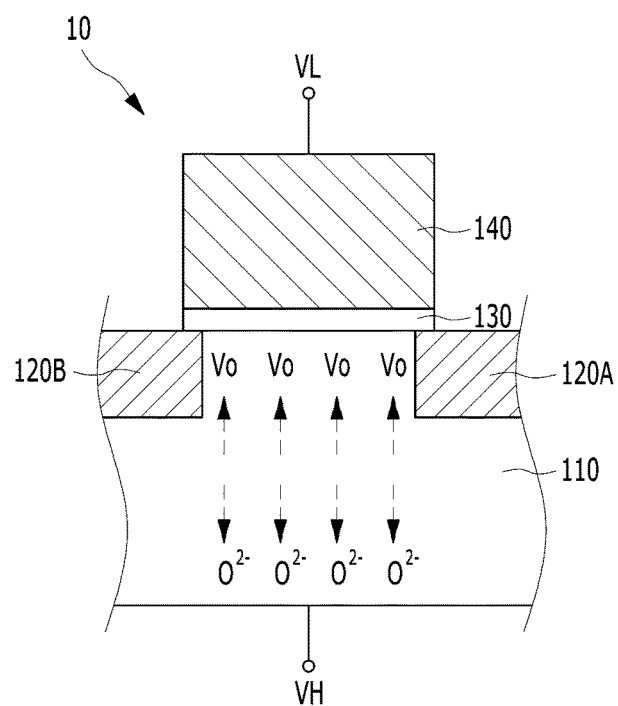
FIGS. 2A and 2B are views illustrating an operating process of the transistor of FIGS. 1A and 1B.
Figure 2B:
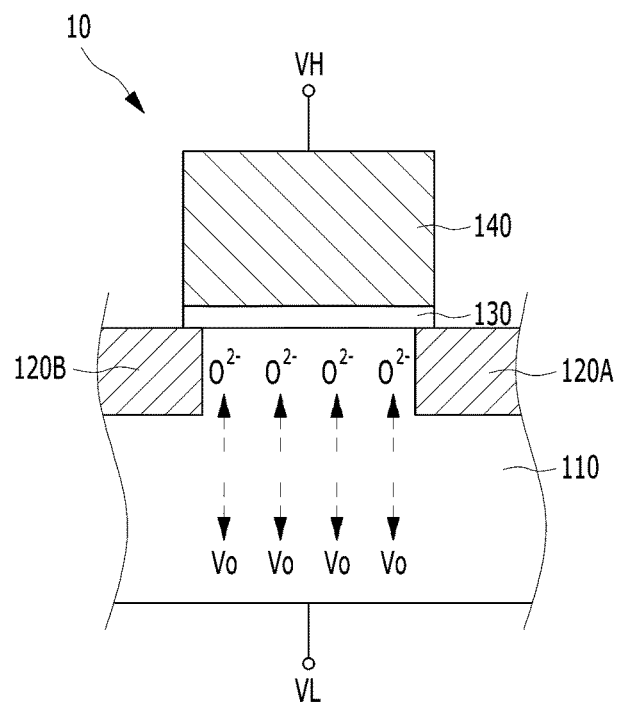

FIGS. 2A and 2B are views illustrating an operating process of the transistor 10 of FIGS. 1A and 1B. FIG. 2A is a view for explaining a turn-on operation of the transistor 10, and FIG. 28 is a view for explaining a turn-off operation of the transistor 10. FIGS. 2A and 2B show some elements useful for explaining the turn-on/turn-off operation among elements shown in FIGS. 1A and 1B.

Referring to FIG. 2A, when a low voltage VL, for example, a ground voltage or a certain negative voltage, is applied to the gate electrode 140 and a high voltage VH, for example, a certain positive voltage, is applied to the body 110 oxygen vacancies Vo in the body 110 may move toward the gate electrode 140, that is, toward an upper portion of the body 110 between the first junction region 120A and the second junction region 120B. Under these conditions, oxygen ions $O^{2-}$ in the body 110 may move away from the gate electrode 140, that is, toward a lower portion of the body 110. Therefore, a conductive channel may be formed in the upper portion of the body 110 by the oxygen vacancies Vo under the gate electrode 140, so that a corresponding region may be in a low resistance state. The first and second junction regions 120A and 120B may be electrically connected with each other by the conductive channel. As a result, the transistor 10 may be turned on.

Referring to FIG. 28, when a high voltage VH, for example, a certain positive voltage, is applied to the gate electrode 140 and a low voltage VL, for example, a ground voltage or a certain negative voltage, is applied to the body 110, oxygen ions $O^{2-}$ in the body 110 may move toward the gate electrode 140. Under these conditions, oxygen vacancies Vo in the body 110 may move away from the gate electrode 140. Therefore, the conductive channel that had been formed by the oxygen vacancies Vo may cease to exist, so that a corresponding region may be in a high resistance state. As a result, the transistor 10 may be turned off.

An example of a process for fabricating the above transistor 10 of FIGS. 1A and 1B will be briefly described as below.

Referring again to FIGS. 1A and 1B, the body 110 may be formed by depositing a metal oxide material over the substrate 100 and selectively etching the metal oxide material. A space between the body 110 and another body (not shown) may be filled with an insulating material to form an isolation layer (not shown).

Then, first and second trenches TA and TB may be formed in the body 110 by selectively etching portions of the body 110 corresponding to regions in which the first and second junction regions 120A and 120B are to be formed.

Then, the first and second junction regions 120A and 1208 may be formed filling the first and second trenches TA and TB, respectively, by forming a conductive material covering the body 110 including the first and second trenches TA and TB and performing a planarization process, for example, a CMP (Chemical Mechanical Polishing) process, until a top surface of the body 110 is exposed.

Then, the gate insulating layer 130 and the gate electrode 140 may be formed by sequentially depositing an insulating material and a conductive material over the body 110 and the first and second junction regions 120A and 120B, and selectively etching the insulating material and the conductive material. However, in another implementation, only the conductive material may be selectively etched. In this case, the deposited insulating material may be the gate insulating layer 130.

Then, the first and second contacts 150A and 150B coupled to the first and second junction regions 120A and 120B, respectively, may be formed by forming an interlayer dielectric layer (not shown) covering a resultant structure in which the gate electrode 140 is formed, selectively etching the interlayer dielectric layer to form a hole exposing each of the first and second junction regions 120A and 120B, and filling the hole with a conductive material.

Then, although not shown, various following processes, for example, a process for forming the memory element coupled to the first contact 150A, a process for forming the line coupled to the second contact 150B, etc., may be performed.

By the transistor 10 and the process thereof in accordance with the above implementation, the following advantages may be obtained.

First, by forming the body 110 with a metal oxide which is a variable resistance material and can be used as a memory element, a turn-on state or a turn-off state of the transistor 10 may be maintained without applying a voltage to a gate and/or a body. That is, it is possible to obtain a non-volatile transistor. Also, an on-current characteristic and an off-current characteristic of the transistor 10 may be improved compared to a conventional transistor using a silicon body. Specifically, in the conventional transistor, a leakage current through a channel and a junction may be generated when the conventional transistor is in an off-state, and there may be a limit to a maximum on-current. This is because silicon which forms the body of the conventional transistor has a small energy band. On the other hand, in this implementation, because a metal oxide which has a large energy band may be used to form the body 110 of the transistor 10, a leakage current may be minimized, and thus an off-current may be very low. Also, it is possible to push oxygen ions out of a channel region during a turn-on operation of the transistor 10, so a maximum on-current may be increased relative to the conventional transistor.

Further, a cost and a level of difficulty in a process for fabricating the above transistor 10 may be low.

Because of the above advantages, the transistor 10 may be used in various types of electronic devices. For example, the transistor 10 may be applicable to portable and battery-powered household appliances, or an IC chip such as a gas sensor, etc.

In the above implementation, the transistor 10 having a 2-dimensional type in which a channel is formed to be parallel to a surface of the substrate 100 has been described. However, implementations are not limited thereto, and in other implementations, various types of transistors using a metal oxide body may be formed. For example, a transistor having a 3-dimensional type in which a channel is formed to be perpendicular to a surface of a substrate may be formed. An exam pie of a 3-dimensional transistor will be described with reference to FIGS. 3A and 3B.

Figure 3A:
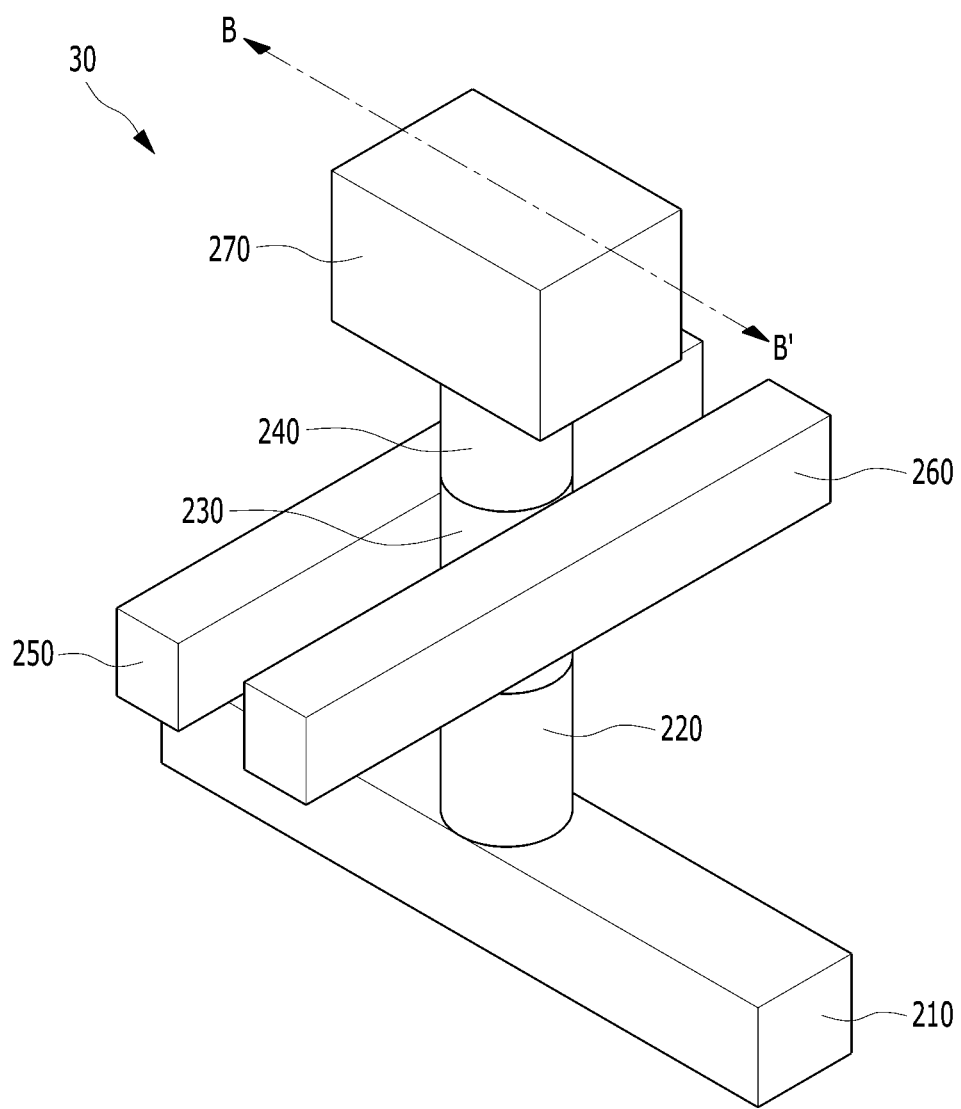
FIGS. 3A and 3B are views illustrating a transistor accordance with another implementation.
Figure 3B:
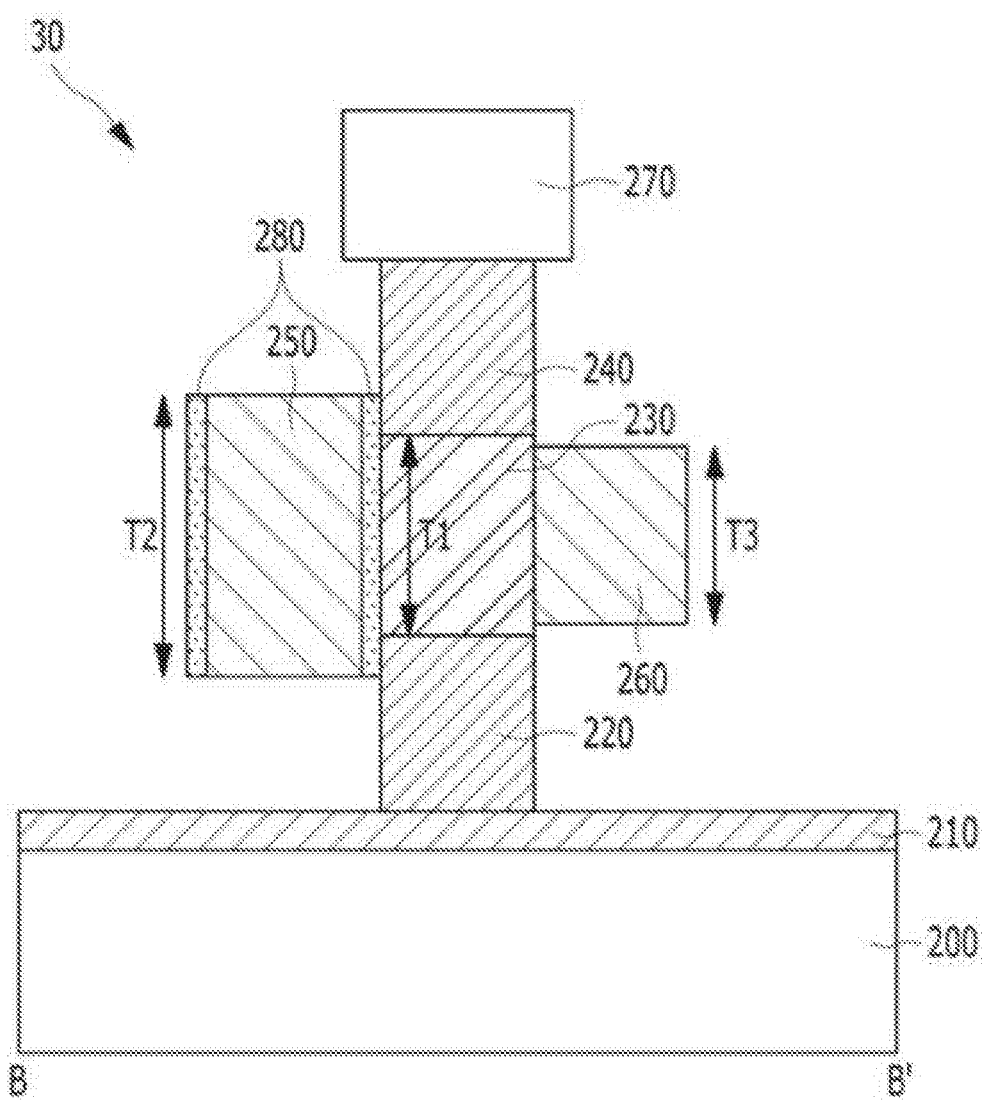

FIGS. 3A and 3B are views illustrating a transistor 30 in accordance with another implementation. Specifically, FIG. 3A is a perspective view, and FIG. 3B is a cross-sectional view taken along a line B-B' of FIG. 3A.

Referring to FIGS. 3A and 3B, the transistor 30 may include a substrate 200, a body 230 formed over the substrate 200 and having a pillar shape, a gate electrode 250 being adjacent to a first side of the body 230 with a gate insulating layer (not shown) therebetween, a conductive pattern 260 being in a direct contact with a second side of the body 230 and supplying a body voltage to the body 230, a first contact 220 coupled to a bottom surface of the body 230, and a second contact 240 coupled to a top surface of the body 230.

The substrate 200 may include additional elements, for example, a line 210 including one or more conductive materials for example, a metal, a metal nitride, a semiconductor material doped with an Impurity, or a combination thereof. The line 210 may be coupled to the first contact 220, disposed under the first contact 220 and extend in a direction parallel to the line B-B'. The line 210 may serve as a bit line.

The body 230 may perform a substantially identical function as the body 110 of the above implementation of FIGS. 1A and 1B. Also, the body 230 may be formed of a substantially identical material as the body 110 of the above implementation, for example, a metal oxide having a variable resistance characteristic. The gate insulating layer (not shown) may be in contact with a side surface of the body 230 and interposed between the gate electrode 250 and the body 230. The gate electrode 250 and the gate insulating layer may perform a substantially identical function as the gate electrode 140 and the gate insulating layer 130 of the above implementation, respectively. Also, the gate electrode 250 and the gate insulating layer may be formed of a substantially identical material as the gate electrode 140 and the gate insulating layer 130 of the above implementation, respectively. In this implementation, the body 230, the gate insulating layer and the gate electrode 250 may be arrayed along a direction parallel to a surface of the substrate 200 while the body 110, the gate insulating layer 130 and the gate electrode 140 are stacked in a direction perpendicular to a surface of the substrate 100 in the above implementation of FIGS. 1A and 1B. Therefore, a direction of a channel formed in the body 230 may be perpendicular to the surface of the substrate 200.

The conductive pattern 260 for supplying the body voltage is disposed at the second side of the body 230 in direct contact with the body 230. That is, the conductive pattern 260 may be arrayed along the direction parallel to the surface of the substrate 200 together with the body 230, the gate insulating layer and the gate electrode 250. The conductive pattern 260 may include one or more conductive materials, for example, a metal, a metal nitride, a semiconductor material doped with an impurity, or a combination thereof.

One of the first contact 220 and the second contact 240 may perform a substantially identical function and be formed of a substantially identical material as the first junction region 120A and the first contact 150A of the above implementation, and the other of the first contact 220 and the second contact 240 may perform a substantially identical function and be formed of a substantially identical material as the second junction region 120B and the second contact 150B of the above implementation.

In this implementation, the gate electrode 250 may be located at the first side of the body 230 and the conductive pattern 260 may be located at the second side of the body 230 which is opposite to the first side of the body 230. Also, the gate electrode 250 and the conductive pattern 260 may have a line shape which extends in a certain direction, for example the direction at a right angle to the line B-B'. However, other implementations are also possible. The gate electrode 250 and the conductive pattern 260 may have various shapes and/or various arrangements as long as the gate electrode 250 and the conductive pattern 260 are insulated from each other.

Also, the gate electrode 250 may overlap with the first side of the body 230 and have a thickness T2 which is the same as or larger than a thickness T1 of the body 230. That is, a top surface of the gate electrode 250 may be located at a same level as or above a top surface of the body 230, and a bottom surface of the gate electrode 250 may be located at a same level as or below a bottom surface of the body 230. As described below, a conductive channel may be formed by oxygen vacancies inside the body 230 in a region overlapping with the gate electrode 250. Therefore, when the thickness T2 of the gate electrode 250 is the same as or larger than the thickness T1 of the body 230, the conductive channel, which electrically connects the first contact 220 and the second contact 240 with each other, may be formed.

The conductive pattern 260 may overlap with the second side of the body 230 and have a thickness T3 which is the same as or smaller than the thickness T1 of the body 230. That is, a top surface of the conductive pattern 260 may be located at a same level as or below the top surface of the body 230 and a bottom surface of the conductive pattern 260 may be located at a same level as or above the bottom surface of the body 230. This is for the purpose of preventing an electrical short from occurring between the conductive pattern 260 and the first contact 220 or between the conductive pattern 260 and the second contact 240 while coupling the conductive pattern 260 and the body 230 with each other.

A memory element 270 may be formed over the second contact 240 to be coupled to the second contact 240. The memory element 270 may be a capacitor or a variable resistance element. The variable resistance element may switch between different resistance states according to a voltage or current applied thereto, and have a single-layered structure or a multi-layered structure including one or more of various variable resistance materials that are used in an RRAM, a PRAM, an FRAM, an MRAM, etc. The variable resistance materials may include a metal oxide such as a transition metal oxide or a perovskite-based material, a phase change material such as a chalcogenide-based material, a ferroelectric material, a ferromagnetic material, etc. When the memory element 270 is the variable resistance element, another line (not shown) such as a source line may be formed to be electrically connected to a top end of the memory element 270. When the transistor 30 is turned on in order to access to the memory element 270, an operating voltage or current may be supplied to the memory element 270 through the first line 210 and/or another line (not shown).

A turn-on operation and/or a turn-off operation of the transistor 30 of this implementation may be substantially identical to that of the above implementation of FIGS. 1A and 1B, except for a direction of a channel.

Specifically, when a low voltage is applied to the gate electrode 250 and a high voltage is applied to the body 230 through the conductive pattern 260, oxygen vacancies in the body 230 may move toward the gate electrode 250, that is, toward the first side of the body 230. Therefore, a conductive channel having a perpendicular direction relative to the substrate 200 may be formed to electrically connect the first contact 220 and the second contact 240 with each other at the first side of the body 230. As a result, the transistor 30 may be turned on.

On the other hand, when a high voltage is applied to the gate electrode 250 and a low voltage is applied to the body 230 through the conductive pattern 260, the oxygen vacancies in the body 230 may move away from the gate electrode 250, that is, toward the second side of the body 230. Therefore, the conductive channel of the first side of the body 230 may cease to exist. As a result, the transistor 30 may be turned off.

Examples of a process for fabricating the above transistor 30 will be described with reference to FIGS. 4A to 5B.

FIGS. 4A to 4F are views illustrating a process for fabricating a transistor in accordance with an implementation.

Figure 4A:
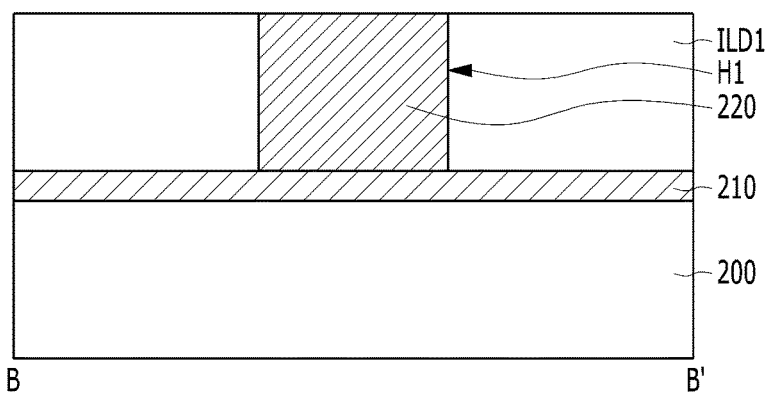
FIGS. 4A to 4F are views illustrating an example of a process for fabricating a transistor in accordance with another implementation.

Referring to FIG. 4A, the line 210, which extends in a first direction for example, the direction parallel to the line B-B', may be formed over the substrate 200 by depositing a conductive material over the substrate 200 and patterning the conductive material.

Then, a first interlayer dielectric layer ILD1 covering the line 210 may be formed, and a first contact hole H1 exposing a top surface of the line 210 may be formed by selectively etching the first interlayer dielectric layer ILD1. Then, the first contact 220 may be formed by filling the first contact hole H1 with a conductive material. Here, in FIG. 4A, a top surface of the first contact 220 is located at a same level as a top surface of the first interlayer dielectric layer ILD1. However, in another implementation, an upper portion of the first interlayer dielectric layer ILD1 may be further removed so that the top surface of the first interlayer dielectric layer ILD1 is lower than the top surface of the first contact 220. In this case, by following processes, a bottom surface of the gate electrode 250 may be lower than a bottom surface of the body 230.

Figure 4B:
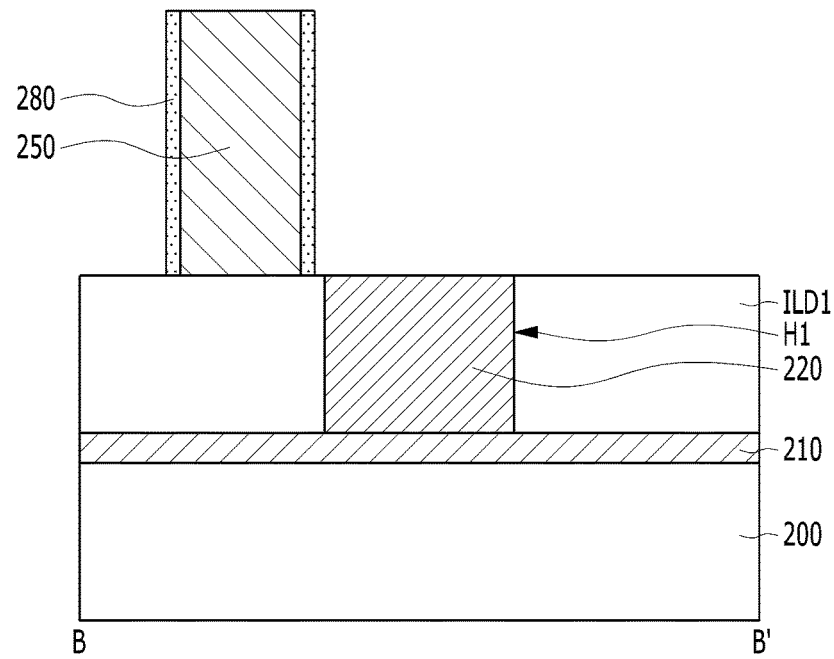

Referring to FIG. 4B, the gate electrode 250 disposed at one side of the first contact 220 may be formed by depositing a conductive material over the first contact 220 and the first interlayer dielectric layer ILD1 and selectively etching the conductive material. The gate electrode 250 may have a line shape which extends in a second direction crossing the first direction.

Then, a gate insulating layer 280 may be formed over sidewalls of the gate electrode 250 by depositing an insulating material along a whole surface of a resultant structure including the gate electrode 250 and performing a blanket etching process on the deposited insulating material.

Figure 4C:
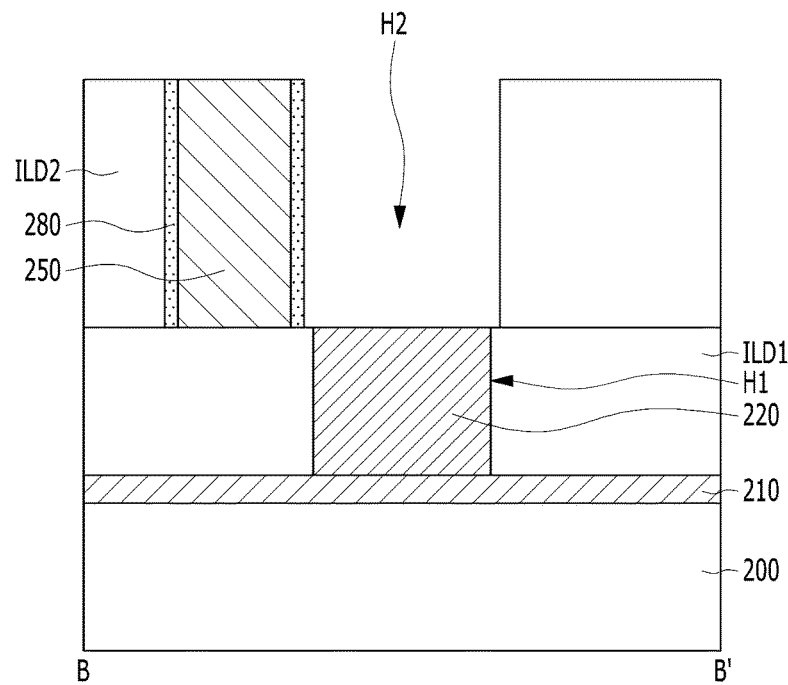

Referring to FIG. 4C, a second interlayer dielectric layer ILD2 may be formed by depositing an insulating material to cover a resultant structure in which the gate electrode 250 and the gate insulating layer 280 are formed and performing a planarization process on the deposited insulating material until a top surface of the gate electrode 250 is exposed.

Then, a second contact hole H2, which exposes a sidewall of the gate insulating layer 280 disposed at one side of the gate electrode 250 and the top surface of the first contact 220, may be formed by selectively etching the second interlayer dielectric layer ILD2.

Figure 4D:
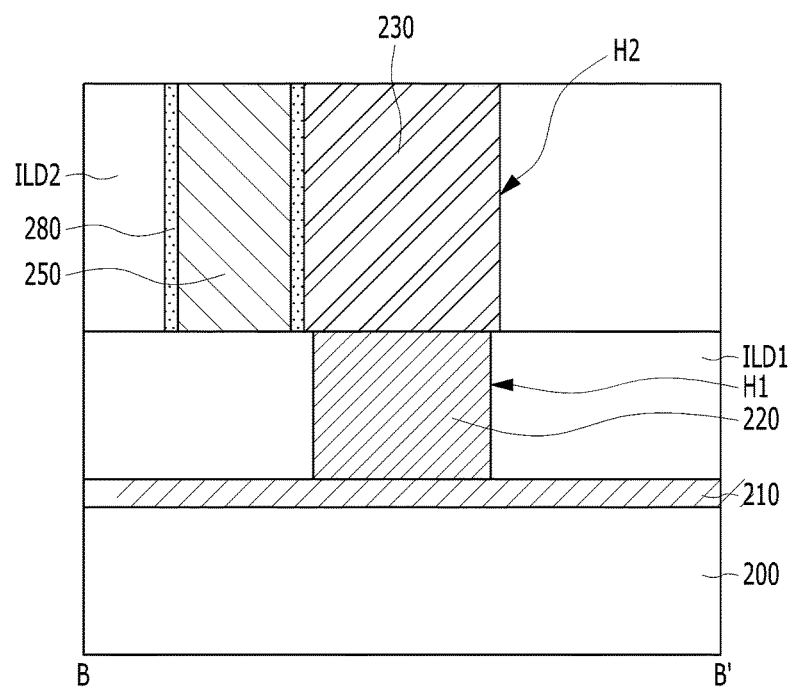

Referring to FIG. 4D, the body 230 may be formed by filling the second contact hole H2 with a metal oxide. Here, in FIG. 4D, the top surface of the body 230 is located at a same level as a top surface of the second interlayer dielectric layer ILD2. However, in another implementation, an upper portion of the body 230 may be further removed so that the top surface of the body 230 is lower than the top surface of the second interlayer dielectric layer ILD2. In this case, the top surface of the gate electrode 250 may be above the top surface of the body 230. As a result of this process, one side of the body 230 may be in contact with the gate insulating layer 280 and the other side of the body 230 may be in contact with the second interlayer dielectric layer ILD2.

Figure 4E:
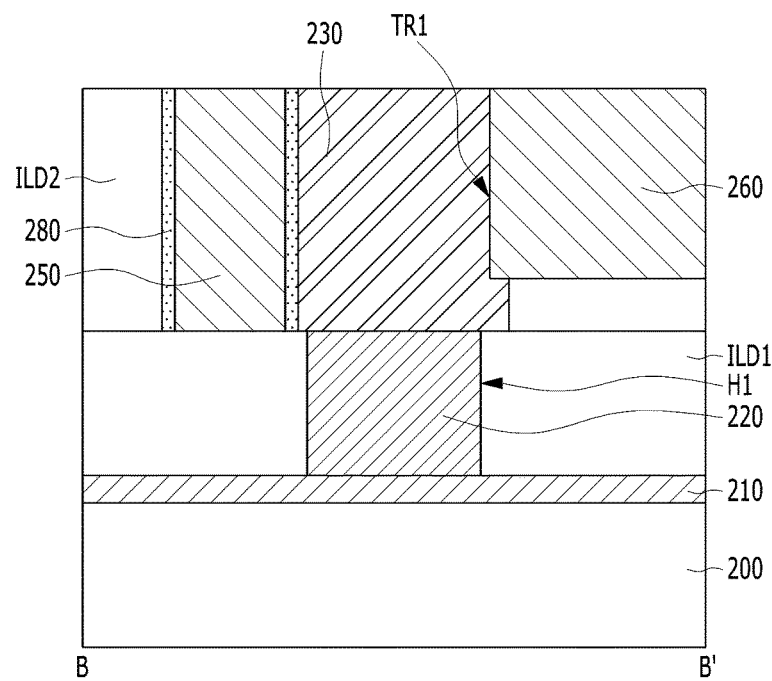

Referring to FIG. 4E, a first trench TR1 which exposes the other side of the body 230 and extends in the second direction, may be formed by selectively etching the second interlayer dielectric layer ILD2 disposed at the other side of the body 230. A bottom surface of the first trench TR1 may be located at a same level as or above a bottom surface of the body 230. Due to a misalignment during the etching of the second interlayer dielectric layer ILD2 for forming the first trench TR1, a portion of the other side of the body 230, which is adjacent to the second interlayer dielectric layer ILD2, may be further etched.

Then, the conductive pattern 260 ray be formed by filling the first trench TR1 with a conductive material. Here, in FIG. 4E, the top surface of the conductive pattern 260 is located at a same level as the top surface of the body 230. However, in another implementation, an upper portion of the conductive pattern 260 may be further removed so that the top surface of the conductive pattern 260 is lower than the top surface of the body 230. As a result of this process, the other side of the body 230 may be in a direct contact with the conductive pattern 260.

Figure 4F:
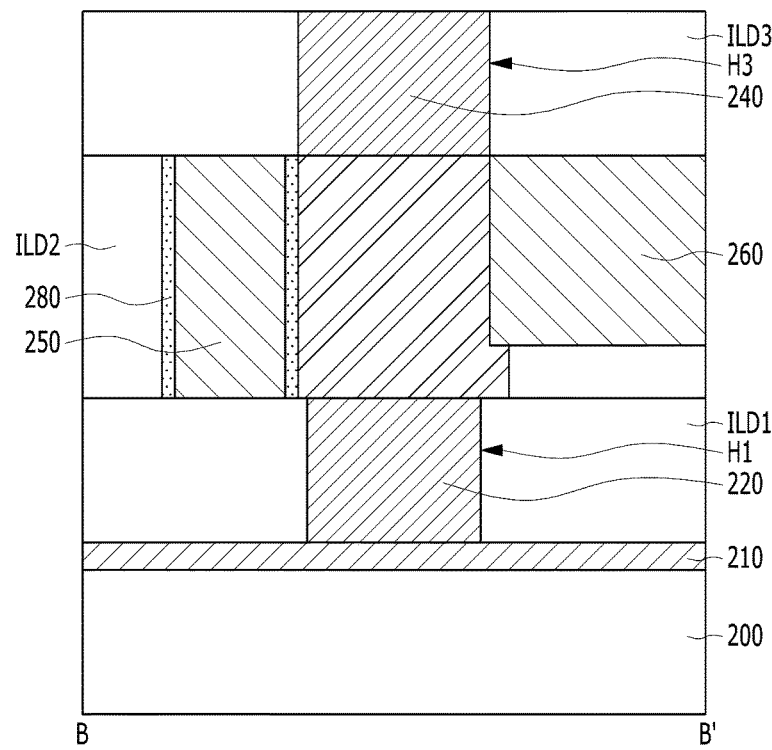

Referring to FIG. 4F, a third interlayer dielectric layer ILD3 may be formed over a resultant structure of FIG. 4E.

Then, a third contact hole H3 exposing the top surface of the body 230 may be formed, and the second contact 240 may be formed by filling the third contact hole H3 with a conductive material.

Then, although not shown, additional elements, such as a memory element, may be formed over the second contact 240.

FIGS. 5A to 5D are views illustrating a process for fabricating a transistor in accordance with another implementation. Differences from the implementation of FIGS. 4A to 4F will be mainly described.

Figure 5A:
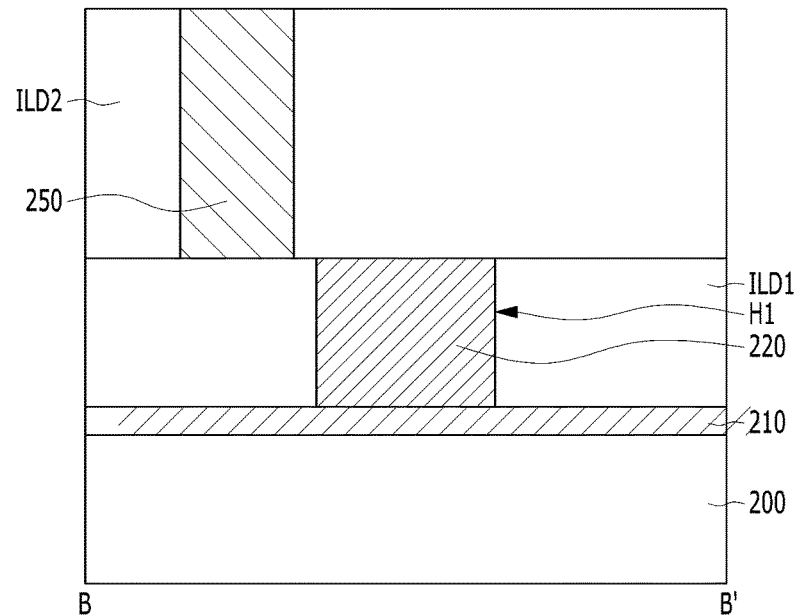
FIGS. 5A to 5D are views illustrating another example of a process for fabricating a transistor in accordance with another implementation.

Referring to FIG. 5A, the line 210 may be formed over the substrate 200.

Then, the first interlayer dielectric layer ILD1 covering the line 210 may be formed, and the first contact 220, which penetrates the first interlayer dielectric layer ILD1 and is coupled to the top surface of the line 210, may be formed.

Then, the gate electrode 250 disposed at one side of the first contact 220 and having a line shape which extends in the second direction may be formed by depositing a conductive material over the first contact 220 and the first interlayer dielectric layer ILD1 and selectively etching the conductive material. A space in which the gate electrode 250 is not formed over the first contact 220 and the first interlayer dielectric layer ILD1 may be filled with the second interlayer dielectric layer ILD2.

Figure 5B:
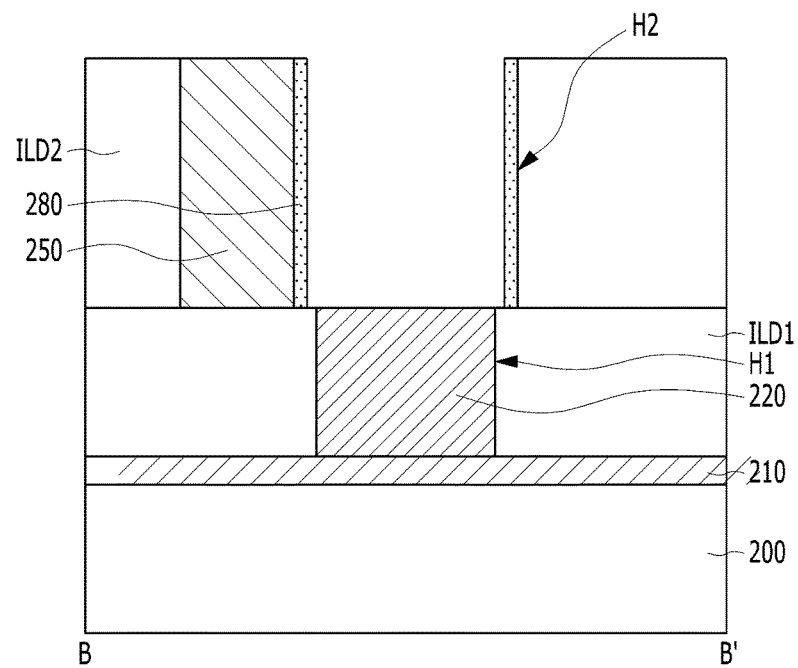

Referring to FIG. 5B, the second contact hole H2, which exposes one sidewall of the gate electrode 250 and the top surface of the first contact 220, may be formed by selectively etching the second interlayer dielectric layer ILD2.

Then, the gate insulating layer 280 may be formed over a sidewall of the second contact hole H2 by depositing an insulating material along a whole surface of a resultant structure including the second contact hole H2 and performing a blanket etching process on the deposited insulating material.

Figure 5C:
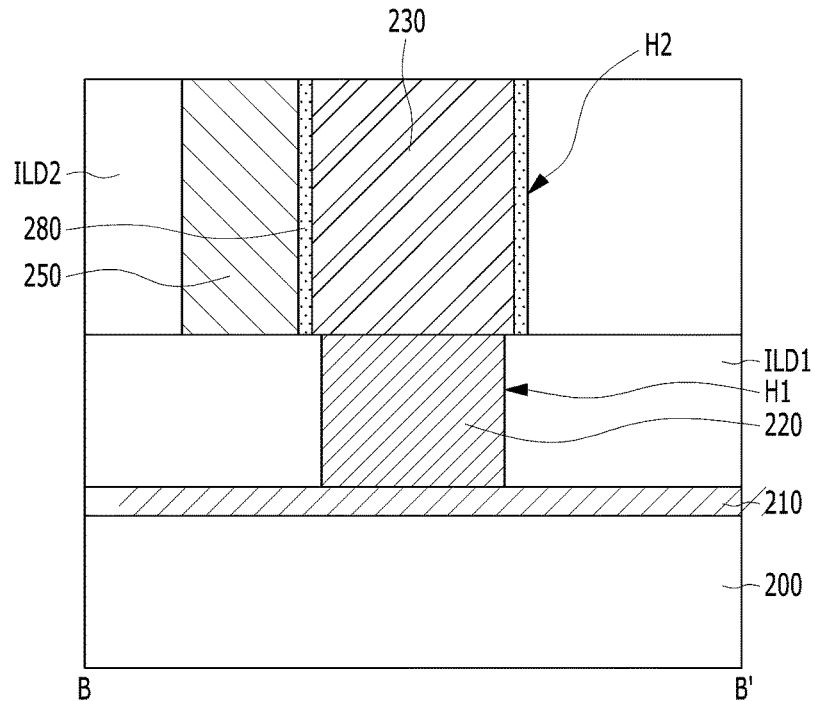

Referring to FIG. 5C, the body 230 may be formed by filling the second contact hole H2 in which the gate insulating layer 280 is formed with a metal oxide.

Figure 5D:
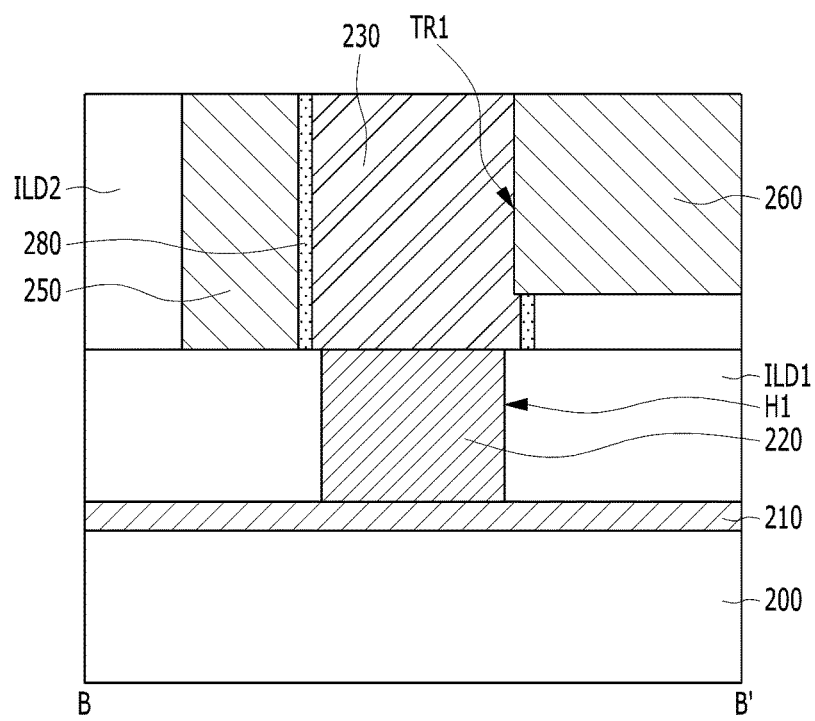

Referring to FIG. 5D, the first trench TR1, which exposes the other side of the body 230 and extends in the second direction, may be formed by selectively etching the second interlayer dielectric layer ILD2 and the gate insulating layer 280, which are disposed at the other side of the body 230.

Then, the conductive pattern 260 may be formed by filling the first trench TR1 with a conductive material.

By the aforementioned processes of FIGS. 4A to 5D, a transistor which is identical or similar to the transistor 30 of FIGS. 3A and 3B may be formed. However, other processes may be used.

The above and other memory circuits or semiconductor devices based on the disclosed technology can be used in a range of devices or systems. FIGS. 6-10 provide some examples of devices or systems that can implement a memory circuit in accordance with an embodiment disclosed herein.

Figure 6:
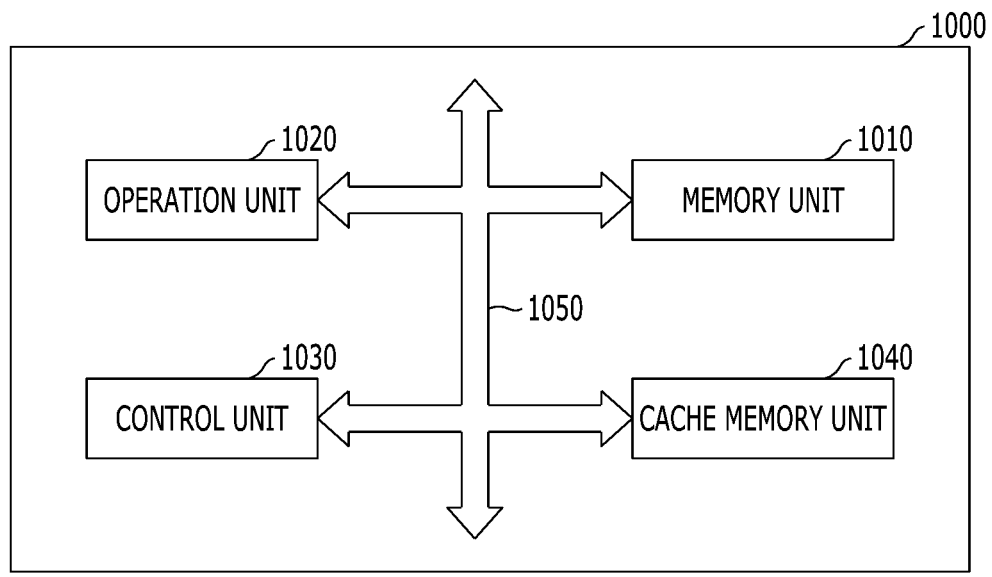
FIG. 6 illustrates a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a transistor comprising a metal oxide body; a gate electrode; and a gate insulating layer interposed between the metal oxide body and the gate electrode, wherein the transistor is turned on or turned off by movement of oxygen vacancies in the metal oxide body according to a voltage applied to the gate electrode and the metal oxide body. Through this, operating characteristics of at least one of the memory unit 1010, the operation unit 1020 and the control unit 1030 may be improved. As a consequence, operating characteristics of the microprocessor 1000 may be improved.

Figure 7:
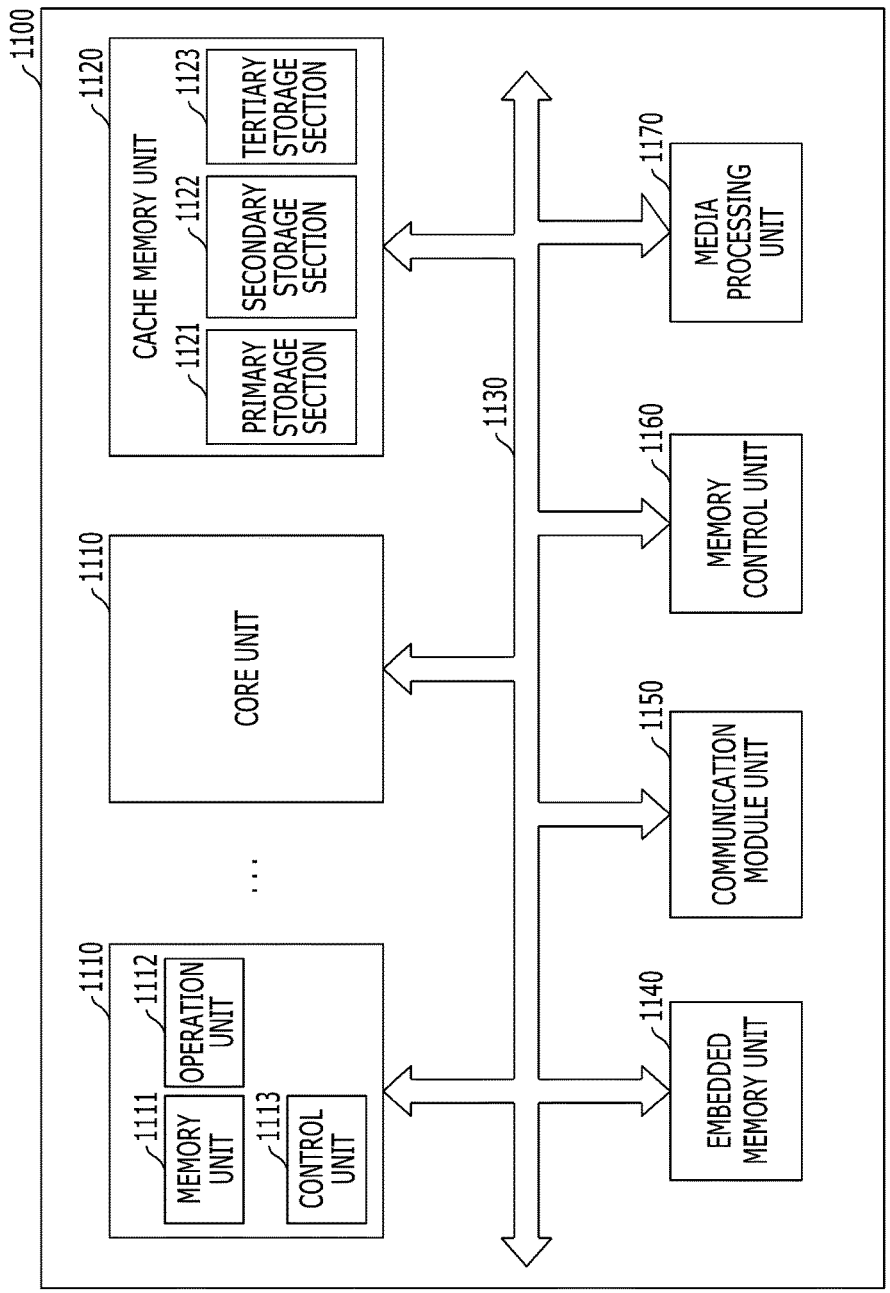
FIG. 7 illustrates a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 7 that it the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according tip the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM) a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a transistor comprising a metal oxide body; a gate electrode; and a gate insulating layer interposed between the metal oxide body and the gate electrode, wherein the transistor is turned on or turned off by movement of oxygen vacancies in the metal oxide body according to a voltage applied to the gate electrode and the metal oxide body. Through this, operating characteristics of at least one of the cache memory unit 1120, the core unit 1110 and the bus interface 1130 may be improved. As a consequence, operating characteristics of the processor 1100 may be improved.

Figure 8:
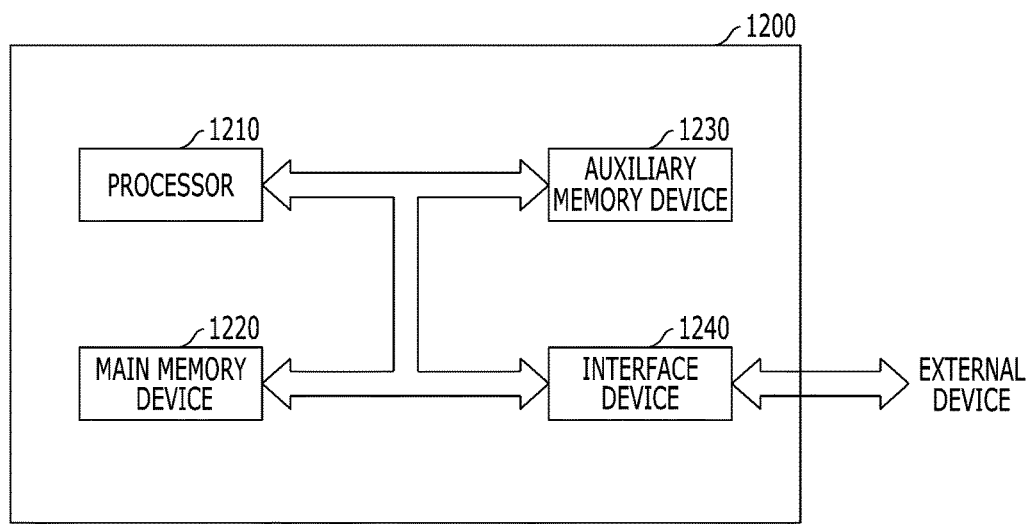
FIG. 8 illustrates a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc, to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing, unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data. Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a transistor comprising a metal oxide body; a gate electrode; and a gate insulating layer interposed between the metal oxide body and the gate electrode, wherein the transistor is turned on or turned off by movement of oxygen vacancies in the metal oxide body according to a voltage applied to the gate electrode and the metal oxide body Through this, operating characteristics of at least one of the processor 1210, the main memory device 1220, the auxiliary memory device 1230 and the interface device 1240 may be improved. As a consequence, operating characteristics of the system 1200 may be improved.

Figure 9:
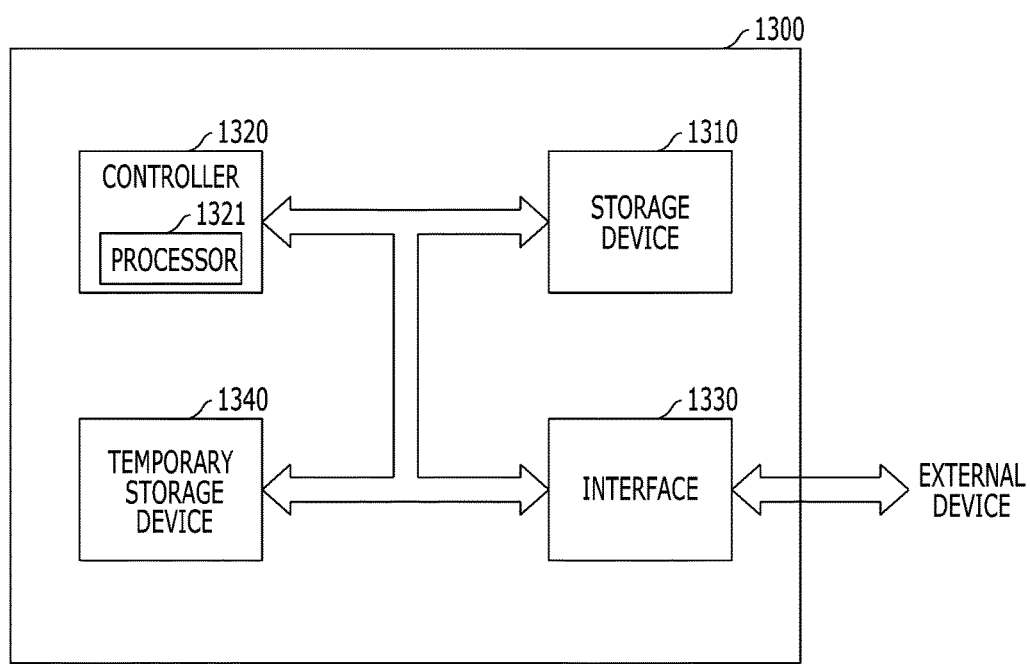
FIG. 9 illustrates a data storage system it implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment) SCSI (Small Computer System Interface), eSATA (External SATA), PCMCIA (Personal Computer Memory Card International Association)) a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a transistor comprising a metal oxide body; a gate electrode; and a gate insulating layer interposed between the metal oxide body and the gate electrode, wherein the transistor is turned on or turned off by movement of oxygen vacancies in the metal oxide body according to a voltage applied to the gate electrode and the metal oxide body. Through this, operating characteristics of at least one of the storage device 1310, the controller 1320, the interface 1330 and the temporary storage device 1340 may be improved. As a consequence, operating characteristics of the data storage system 1300 may be improved.

Figure 10:
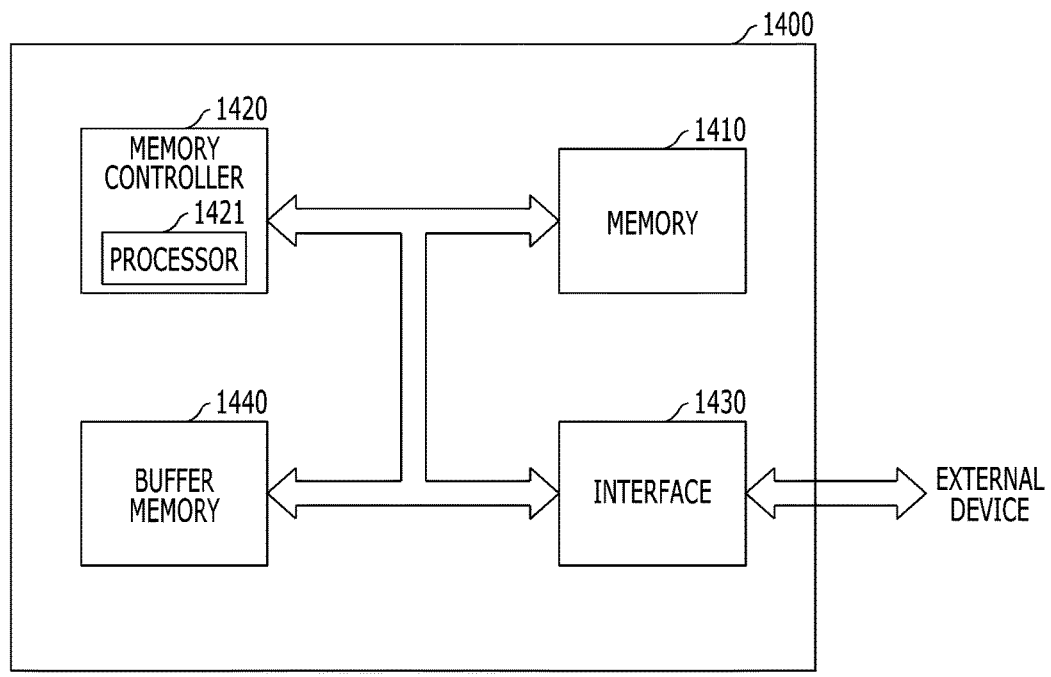
FIG. 10 illustrates a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a transistor comprising a metal oxide body; a gate electrode; and a gate insulating layer interposed between the metal oxide body and the gate electrode, wherein the transistor is turned on or turned off by movement of oxygen vacancies in the metal oxide body according to a voltage applied to the gate electrode and the metal oxide body. Through this, operating characteristics of at least one of the memory 1410, the memory controller 1420, the interface 1430 and the buffer memory 1440 may be improved. As a consequence, operating characteristics of the memory system 1400 may be improved.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a transistor, the transistor comprising:
   a body including a metal oxide;
   a gate electrode;
   a gate insulating layer interposed between the body and the gate electrode,
   a conductive pattern which is in direct contact with a second side surface of the body;
   a first contact coupled to a bottom surface of the body;
   a second contact coupled to a top surface of the body;
   a line coupled to the first contact under the first contact; and
   a memory element coupled to the second contact over the second contact,
   wherein the transistor is turned on or turned off by movement of oxygen vacancies in the body according to voltages applied to the gate electrode and the body,
   wherein the body has a pillar shape which extends in a direction perpendicular to a surface of a substrate, and the gate electrode is in contact with a first side surface of the body with the gate insulating layer therebetween, wherein the gate electrode and the conductive pattern are located to confront each other with the first and second side surfaces of the body therebetween, wherein a top surface of the conductive pattern is located at a same level as or below the top surface of the body, and a bottom surface of the conductive pattern is located at a same level as or above the bottom surface of the body.

2. The electronic device according to claim 1, wherein the conductive pattern supplies a body voltage to the body.

3. The electronic device according to claim 1, wherein each of the gate electrode and the conductive pattern has a line shape which extends in a first direction parallel to the surface of the substrate.

4. The electronic device according to claim 1, wherein a top surface of the gate electrode is located at a same level as or above the top surface of the body, and a bottom surface of the gate electrode is located at a same level as or below the bottom surface of the body.

5. The electronic device according to claim 1, wherein turning the transistor on includes moving the oxygen vacancies toward the gate electrode in the body, and wherein turning the transistor off includes moving the oxygen vacancies away from the gate electrode in the body.

6. The electronic device according to claim 1, wherein oxygen ions in the body move in an opposite direction to the oxygen vacancies.

7. The electronic device according to claim 2, wherein, when the voltage applied to the gate electrode, the body, or both is removed, the transistor maintains an on state or an off state present just before the removal of the voltage.

\* \* \* \* \*